United States Patent
Liu et al.

(10) Patent No.: US 10,895,937 B2
(45) Date of Patent: Jan. 19, 2021

(54) TOUCH SCREEN AND MANUFACTURING METHOD THEREOF, DISPLAY DEVICE

(71) Applicants: BOE Technology Group Co., Ltd., Beijing (CN); Beijing BOE Optoelectronics Technology Co., Ltd., Beijing (CN)

(72) Inventors: Wei Liu, Beijing (CN); Xue Dong, Beijing (CN); Xiaochuan Chen, Beijing (CN); Haisheng Wang, Beijing (CN); Xiaoliang Ding, Beijing (CN); Shengji Yang, Beijing (CN); Yingming Liu, Beijing (CN); Weijie Zhao, Beijing (CN); Hongjuan Liu, Beijing (CN); Changfeng Li, Beijing (CN); Pengpeng Wang, Beijing (CN); Hailin Xue, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 233 days.

(21) Appl. No.: 15/513,424

(22) PCT Filed: Jul. 15, 2016

(86) PCT No.: PCT/CN2016/090188
§ 371 (c)(1),
(2) Date: Mar. 22, 2017

(87) PCT Pub. No.: WO2017/084366
PCT Pub. Date: May 26, 2017

(65) Prior Publication Data
US 2017/0308199 A1   Oct. 26, 2017

(30) Foreign Application Priority Data

Nov. 19, 2015   (CN) .......................... 2015 1 0802599

(51) Int. Cl.
*G06F 3/044* (2006.01)
*G06F 3/041* (2006.01)
(Continued)

(52) U.S. Cl.
CPC ............ *G06F 3/044* (2013.01); *G06F 3/0412* (2013.01); *H01L 27/323* (2013.01);
(Continued)

(58) Field of Classification Search
CPC ................... G06F 3/044; G06F 3/0412; G06F 2203/04102; G06F 2203/04103;
(Continued)

(56) References Cited

U.S. PATENT DOCUMENTS

2008/0182109 A1*   7/2008   Hashimoto ............... B32B 7/02
                                                        428/409
2011/0242027 A1   10/2011   Chang
2014/0353625 A1*   12/2014   Yi ...................... H01L 51/5253
                                                        257/40
(Continued)

FOREIGN PATENT DOCUMENTS

| CN | 202929599 U | 5/2013 |
| CN | 104062817 A | 9/2014 |
| CN | 204215125 U | 3/2015 |

OTHER PUBLICATIONS

Oct. 19, 2019—(WO)—International Search Report and Written Opinion Appn PCT/CN2016/090188 with English Tran.

*Primary Examiner* — Jeff Piziali
(74) *Attorney, Agent, or Firm* — Banner & Witcoff, Ltd.

(57) ABSTRACT

A touch screen and a manufacturing method thereof and a display device are provided. The touch screen includes a base substrate, electroluminescence pixel units disposed on the base substrate and arranged in array, touch electrodes disposed on the electroluminescence pixel units and arranged in array, the electroluminescent pixel units and the touch electrodes are insulated from each other.

20 Claims, 5 Drawing Sheets

(51) Int. Cl.
  *H01L 27/32* (2006.01)
  *H01L 51/00* (2006.01)
  *H01L 51/52* (2006.01)
  *H01L 51/56* (2006.01)
(52) U.S. Cl.
  CPC ...... *H01L 51/0097* (2013.01); *H01L 51/5253* (2013.01); *H01L 51/56* (2013.01); *G06F 2203/04102* (2013.01); *G06F 2203/04103* (2013.01); *G06F 2203/04112* (2013.01); *H01L 51/5225* (2013.01); *H01L 2251/5338* (2013.01)
(58) Field of Classification Search
  CPC ......... G06F 2203/04112; G06F 3/0443; G06F 3/041; H01L 51/56; H01L 27/323; H01L 51/0097; H01L 51/5253; H01L 51/5225; H01L 2251/5338; H01L 27/32; Y02E 10/549
  See application file for complete search history.

(56) References Cited

U.S. PATENT DOCUMENTS

| | | | |
|---|---|---|---|
| 2015/0048346 A1* | 2/2015 | Lee | H01L 27/323 257/40 |
| 2015/0207095 A1* | 7/2015 | Mun | H01L 51/5256 257/40 |
| 2016/0098120 A1* | 4/2016 | Miyake | G06F 3/044 345/174 |
| 2016/0103516 A1* | 4/2016 | An | H01L 51/5256 345/174 |
| 2016/0124557 A1* | 5/2016 | Choi | G06F 3/0412 345/173 |
| 2016/0132154 A1* | 5/2016 | Lee | G06F 3/044 345/174 |
| 2016/0132155 A1* | 5/2016 | Lee | G06F 3/044 345/174 |
| 2016/0195983 A1* | 7/2016 | Miyake | G06F 3/0412 345/174 |
| 2016/0226024 A1* | 8/2016 | Park | H01L 51/5256 |

* cited by examiner

TOUCH SCREEN AND MANUFACTURING METHOD THEREOF, DISPLAY DEVICE

The application is a U.S. National Phase Entry of International Application No. PCT/CN2016/090188 filed on Jul. 15, 2016, designating the United States of America and claiming priority to Chinese Patent Application No. 201510802599.5. filed on Nov. 19, 2015. The present application claims priority to and the benefit of the above-identified applications and the above-identified applications are incorporated by reference herein in their entirety.

TECHNICAL FIELD

Embodiments of the present disclosure relate to a touch screen and a manufacturing method thereof and a display device.

BACKGROUND

Organic light-emitting diode (OLED) display panel is a display device employing an organic material, which has advantages of a low working voltage, a fast response speed, a high luminous efficiency, a wide viewing angle and a wide range of working temperature etc., and the OLED display panel is good for achieving small thickness, low power consumption and bent surface design of the display device.

Figure 1:
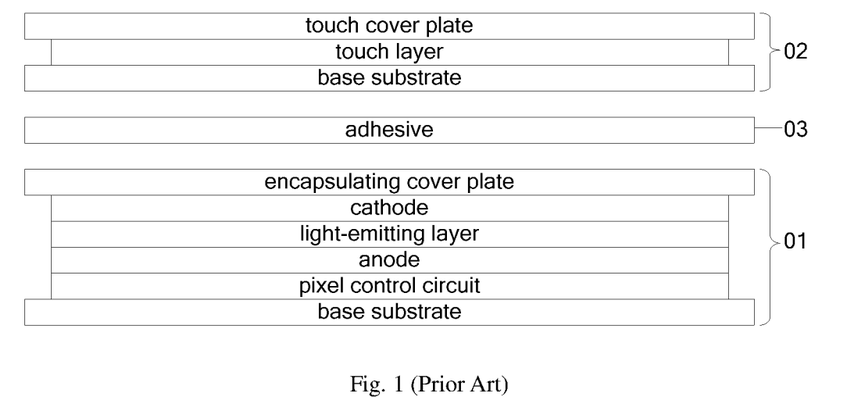
FIG. 1 is a schematic structure diagram of a touch product based on an OLED.

At present, most of the touch products based on the OLED adopt the touch structure as shown in FIG. 1. The OLED display panel 01 and a touch panel 02 are manufactured respectively, a complete touch display device is obtained after the two panels are boned with each other by an adhesive 03. However, for the touch structure shown in FIG. 1, the whole thickness of the touch display device is increased, which is not benefit to achieve the small thickness design of the products.

SUMMARY

Embodiments of the present disclosure provide a touch screen and a manufacturing method thereof and a display device, which is helpful for lightness and thinness design of the OLED touch screen.

According to embodiments of the disclosure, a touch screen is provided. The touch screen comprises: a base substrate, electroluminescence pixel units disposed on the base substrate and arranged in array, touch electrodes disposed on the electroluminescence pixel units and arranged in array. The electroluminescent pixel units and the touch electrodes are insulated from each other.

For example, an orthographic projection of each touch electrode on the base substrate covers at least one of the electroluminescence pixel units.

For example, each touch electrode has a hollow area.

For example, an orthographic projection of each touch electrode on the base substrate located at a gap between the electroluminescence pixel units.

For example, an orthographic projection of each touch electrode on the base substrate has a mesh structure, and the orthographic projections of the electroluminescent pixel units on the base substrate are openings of the mesh structure.

For example, each of the electroluminescence pixel units at least comprises an anode, a light-emitting layer and a cathode.

For example, the cathodes of the electroluminescence pixel units are independent from each other and the cathodes of the electroluminescence pixel units are electrically connected through wires which are arranged in a gap between the electroluminescence pixel units.

For example, the touch screen further comprises: electrode lead wires which are connected with the touch electrodes, wherein orthographic projections of the electrode lead wires on the base substrate are located at an gap between the electroluminescence pixel units.

For example, the electrode lead wires and the touch electrodes are arranged in a same layer.

For example, the touch electrodes are made of a nano silver, a graphene, or a doped metal material.

For example, the touch screen further comprises: an insulating layer arranged between the electroluminescent pixel units and the touch electrodes.

For example, the touch screen further comprises: a polymer film disposed between the electroluminescent pixel units and the touch electrodes and encapsulates side surfaces of the electroluminescent pixel units.

For example, the touch screen is a flexible touch screen.

According to the embodiments of the disclosure, a display device is provided. The display device comprises the touch screen described above.

According to the embodiments of the disclosure, a manufacturing method of a touch screen is provided. The method comprises: providing a base substrate; forming electroluminescence pixel units arranged in array on the base substrate; and forming touch electrodes arranged in array on the electroluminescence pixel units. The electroluminescent pixel units and the touch electrodes are insulated from each other.

For example, the touch electrodes are formed by an ink-jet printing method.

For example, before forming the touch electrodes by the ink-jet printing method, the method further comprises: forming an insulating layer on the electroluminescent pixel units and roughening the surface of the insulating layer.

For example, before forming the touch electrodes by the ink-jet printing method, the method further comprises: forming a polymer film which is provided on the electroluminescent pixel units and encapsulates side surfaces of the electroluminescent pixel units and roughening the surface of the polymer film.

For example, forming the electroluminescent pixel units comprises: forming an anode, a light-emitting layer and a cathode sequentially on the base substrate.

For example, the cathodes of the electroluminescence pixel units are independent from each other and the cathodes of the electroluminescence pixel units are connected through wires which are arranged in a gap between the electroluminescence pixel units.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 2A:
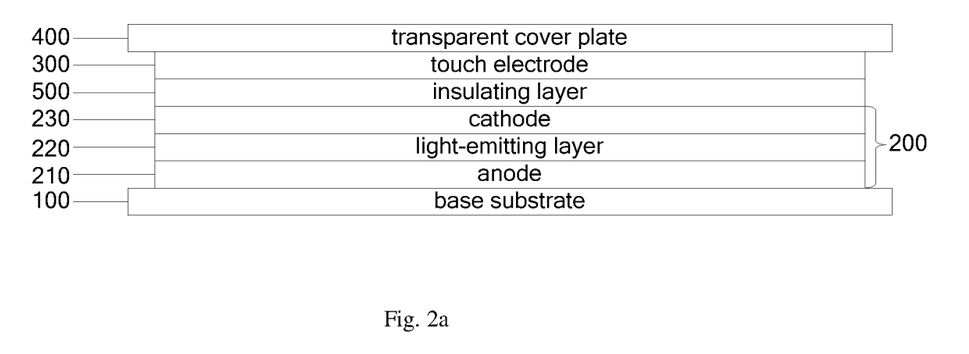
FIG. 2a is a schematic structure diagram of a touch screen provided by embodiments of the present disclosure.
Figure 2B:
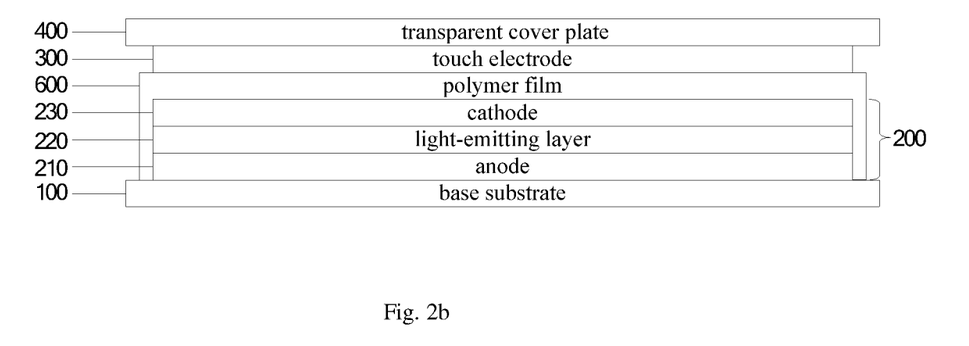
FIG. 2b is a schematic structure diagram of another touch screen provided by the embodiments of the present disclosure.

A touch screen is provided by embodiments of the present disclosure, for example, FIG. 2a is a schematic structure diagram of the touch screen provided by the embodiments of the present disclosure, and FIG. 2b is a schematic structure diagram of another touch screen provided by the embodiments of the present disclosure. With reference to FIG. 2a and FIG. 2b, the touch screen includes a base substrate 100, a plurality of electroluminescence pixel units 200 which are disposed on the base substrate 100 and arranged in array, touch electrodes 300 which are disposed on the electroluminescence pixel units 200 and arranged in array, the touch electrodes 300 and the electroluminescent pixel units 200 are insulated from each other.

In the touch screen provided by the embodiments of the present disclosure, the touch electrodes 300 arranged in array are disposed within the OLED display panel, and the touch electrodes 300 are disposed on the electroluminescence pixel units 200 and isolated from the electroluminescence pixel units 200, the touch screen has a reduced thickness and is favorable for the lightness and thinness design of the touch display products.

Further, during using the touch screen, the user needs to contact and press the screen frequently, so a protective cover plate is arranged to protect the touch screen. Therefore, in the touch screen provided by the embodiments of the present disclosure, as shown in FIG. 2a and FIG. 2b, a transparent cover plate 400 is arranged on the touch electrodes 300. The transparent cover plate 400 is configured for protecting the screen, and further preventing water and oxygen from damaging the electroluminescent pixel units 200, thereby the influence of water and oxygen on the display function is reduced.

For example, in an exemplary manner, in the touch screen provided by the embodiments of the present disclosure, in order to ensure that the touch electrodes 300 and the electroluminescent pixel units 200 are insulated from each other, as shown in FIG. 2a, an insulating layer 500 is arranged between the electroluminescent pixel units 200 and the touch electrodes 300.

Further, the luminescent material of each electroluminescent pixel unit 200 is easily corroded by water and oxygen, therefore, in the touch screen provided by the embodiments of the present disclosure, as shown in FIG. 2b, a polymer film 600 is disposed between the electroluminescent pixel units 200 and the touch electrodes 300 and further encapsulates side surfaces of the electroluminescent pixel units 200 for eliminating or reducing the damage of the external water and oxygen to the electroluminescent pixel units 200 while insulating the electroluminescent pixel units 200 from the touch electrodes 300.

Further, the touch screen provided by the embodiments of the present disclosure is applicable to a flexible touch screen, accordingly, the polymer film 600 which encapsulates the side surfaces of the electroluminescent pixel units 600 and the transparent cover plate 400 for example are made of a flexible material.

For example, in the touch screen provided by the embodiments of the present disclosure, the touch electrodes 300 are formed in an ink-jet printing method. The ink-jet printing method simplifies the process of making the touch electrodes 300 and reduces the cost.

For example, a nano silver, a graphene and a doped metal solution is used as a printing solution to make the touch electrodes 300. That is, the touch electrodes 300 are made of the nano silver, the graphene, and/or the doped metal material.

Figure 3:
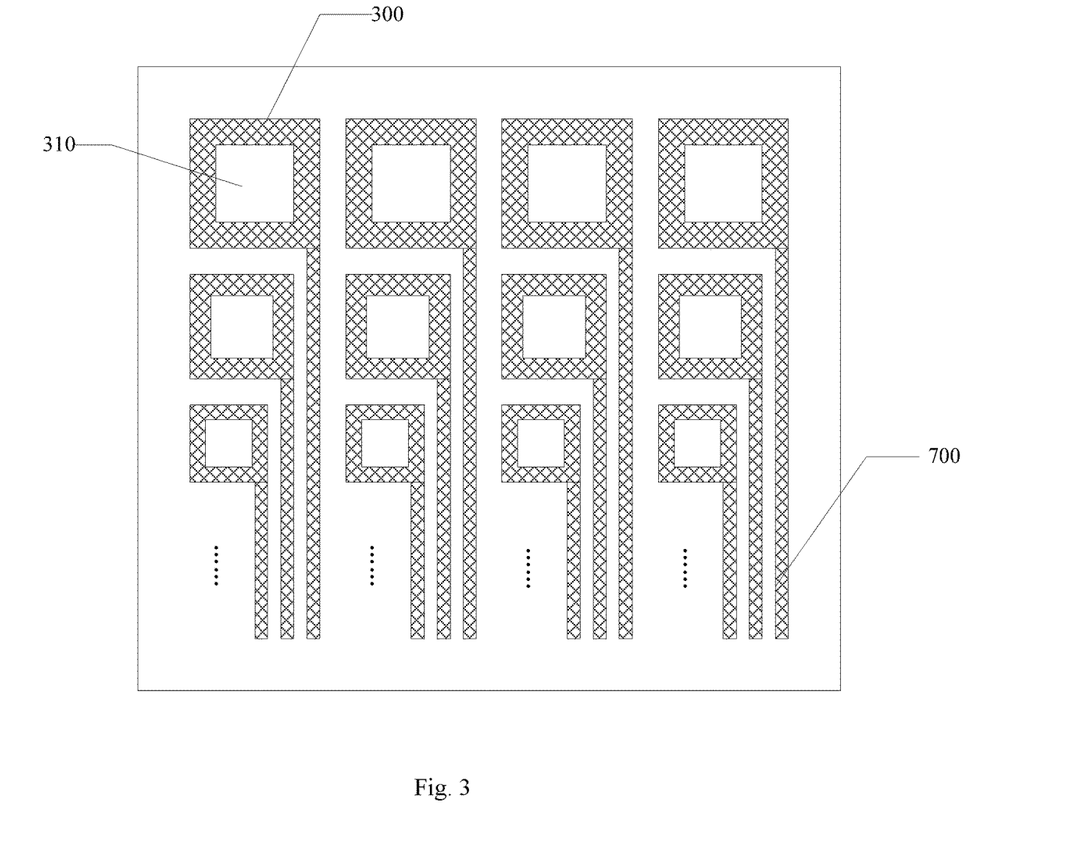
FIG. 3 is a schematic structure diagram illustrating that touch electrodes and electrode lead wires are arranged in a same layer in the touch screen provided by the embodiments of the present disclosure.

In the touch screen provided by the embodiments of the present disclosure, the selection of the material of the touch electrodes 300 affects the transmittance of the touch screen. For example, in the case that a solution with high transmittance is selected for fabricating the touch electrodes 300, the touch electrodes 300 are arranged to face to the electroluminescent pixel units 200, that is, an orthographic projection of each touch electrode 200 on the base substrate 100 covers at least one of the electroluminescent pixel units 200. In order to reduce the parasitic capacitance of the touch electrodes 300 and enhance the touch performance, as shown in FIG. 3, each of the touch electrodes 300 for example is partially hollowed, namely, each of the touch electrodes 300 has a hollow area 310.

For example, in the case that a solution having low transmittance is used to fabricate the touch electrodes 300, each touch electrode 300 is arranged to face to a gap between the electroluminescent pixel units 200, that is, the orthographic projection of each touch electrode 300 on the base substrate 100 is located at the gap between the electroluminescent pixel units 200, for example, the orthographic projection of each touch electrode 300 on the base substrate 100 is located only at the gap between the electroluminescent pixel units 200, so as to minimize the influence of the touch electrodes 300 on the aperture ratio of the screen.

Figure 4:
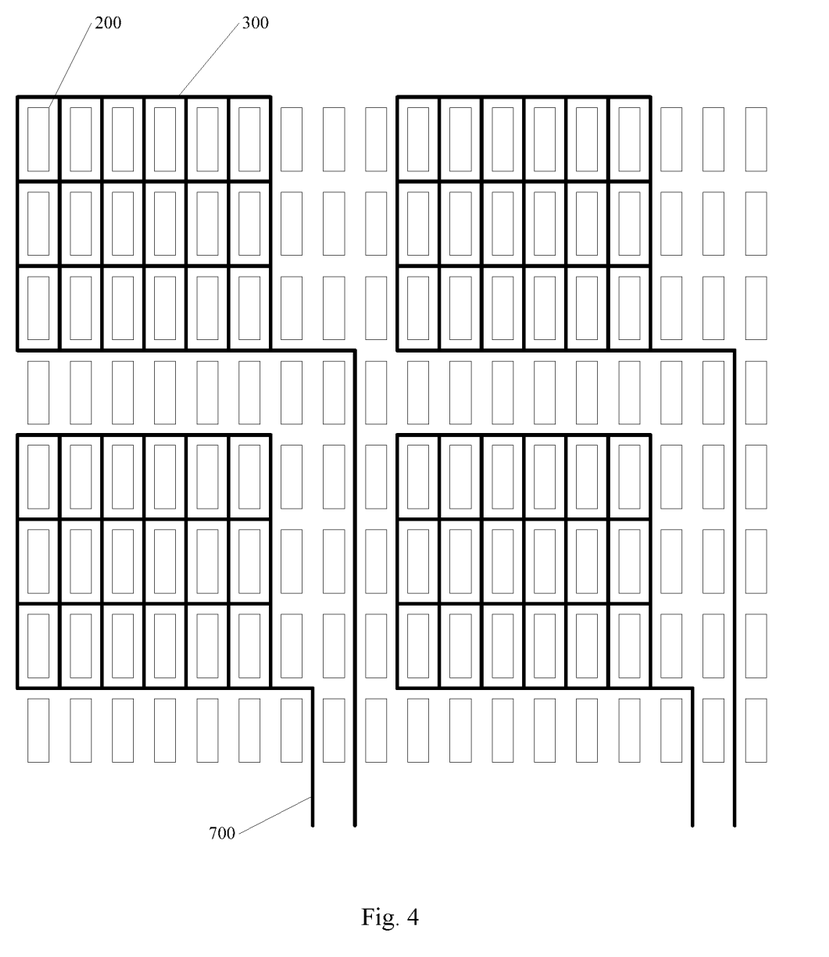
FIG. 4 is a schematic structure diagram illustrating that the touch electrodes and the electrode lead wires are arranged in a same layer in the touch screen provided by the embodiments of the present disclosure.

For example, FIG. 4 is a schematic structure diagram illustrating that the touch electrodes and electrode lead wires are arranged in a same layer in the touch screen provided by the embodiments of the present disclosure. For example, in the embodiments of the present disclosure, the orthographic projection of each touch electrode 300 on the base substrate 100 has a mesh structure, and the orthographic projections of the electroluminescent pixel units 200 on the base substrate 100 are openings of the mesh structure.

Figure 5:
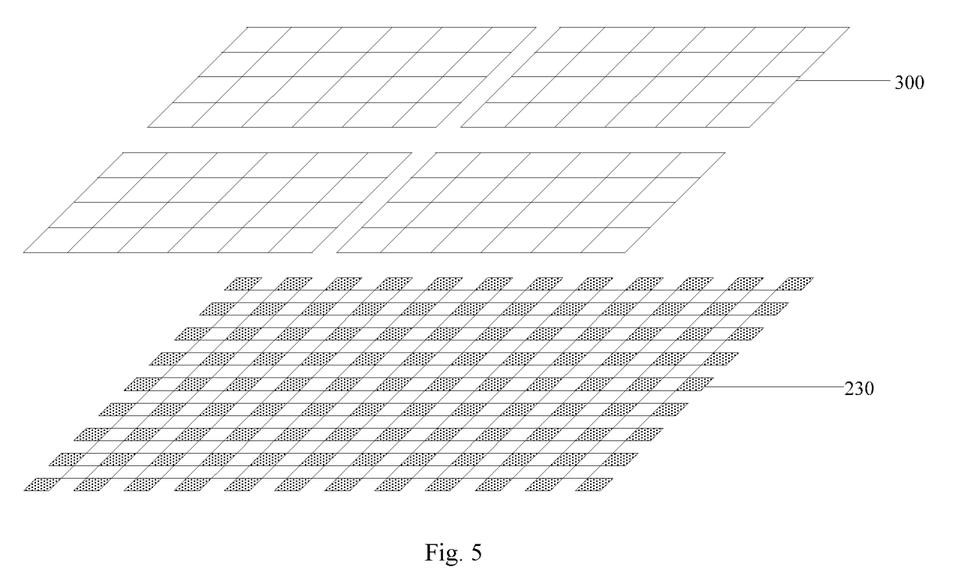
FIG. 5 is a schematic structure diagram of cathodes and touch electrodes provided by the embodiments of the present disclosure.

In the touch screen provided by the embodiments of the present disclosure, as shown in FIG. 2a and FIG. 2b, each of the electroluminescent pixel unit 200 at least includes an anode 210, a light emitting layer 220 and a cathode 230. The parasitic capacitance of the touch electrodes 300 is reduced by reducing the overlap area between the cathodes 230 and the touch electrodes 300. For example, as shown in FIG. 5, the cathodes 230 are separated from each other according to the electroluminescent pixel units (in related art, the cathodes are formed into an integral plate electrode covering the entire surface of the base substrate), that is, the cathodes 230 of the electroluminescent pixel units 200 are independent from each other. The cathodes 230 of the electroluminescent pixel units 200 independent from each other are electrically connected with each other through wires located at the gaps between the electroluminescent pixel units 200, so that the electrical signals are transmitted to all of the cathodes 230. The overlap area of the touch electrodes 300 and the cathodes 230 is reduced so that the parasitic capacitance of the touch electrodes 300 is reduced while the aperture ratio of the touch screen is ensured.

For example, in the touch screen provided by the embodiments of the present disclosure, each touch electrode 300 is provided to have a single layer or multiple layers, and each touch electrode 300 is a mutual-capacitive electrode which is detected based on a mutual capacitance or a self-capacitive electrode which is detected based on a self-capacitance. There is no limit of a shape of an outline of each touch electrode 300, For example, the shape of the outline of the touch electrode 300 is a rectangular, a triangular, a rhombus, etc.

For example, in the touch screen provided by the embodiments of the present disclosure, as shown in FIG. 3 and FIG. 4, the touch screen further includes the electrode lead wires 700 connected with the touch electrodes 300, the electrode lead wires 700 are configured for transmitting the electrical signals to the touch electrodes 300. In order not to affect the aperture ratio and light transmittance of the touch screen, the electrode lead wires 700 are arranged to face to the gaps between the electroluminescent pixel units 200, that is, the orthographic projections of the electrode lead wires 700 on the base substrate 100 are located at the gaps between the electroluminescence pixel units 200.

For example, in the touch screen provided by the embodiments of the present disclosure, as shown in FIG. 3 and FIG. 4, the electrode lead wires 700 and the touch electrodes 300 are provided in a same layer, so that the total number of the layers in the touch screen is reduced; however, in this case, a touch blind area may exist. Upon touching the areas where the electrode lead wires 700 are located, induction signals are generated at the positions of the touch electrodes 300 connected to the electrode lead wires 70 and the positions of the electrode lead wires 700; in order to reduce the affect of the touch blind area on the touch detection, the areas of the electrode lead wires 700 are divided into blocks in advance and a threshold is set for respective blocks by testing and collecting data so as to compensate the touch detection of the areas where the electrode lead wires 700 are located.

Figure 6:
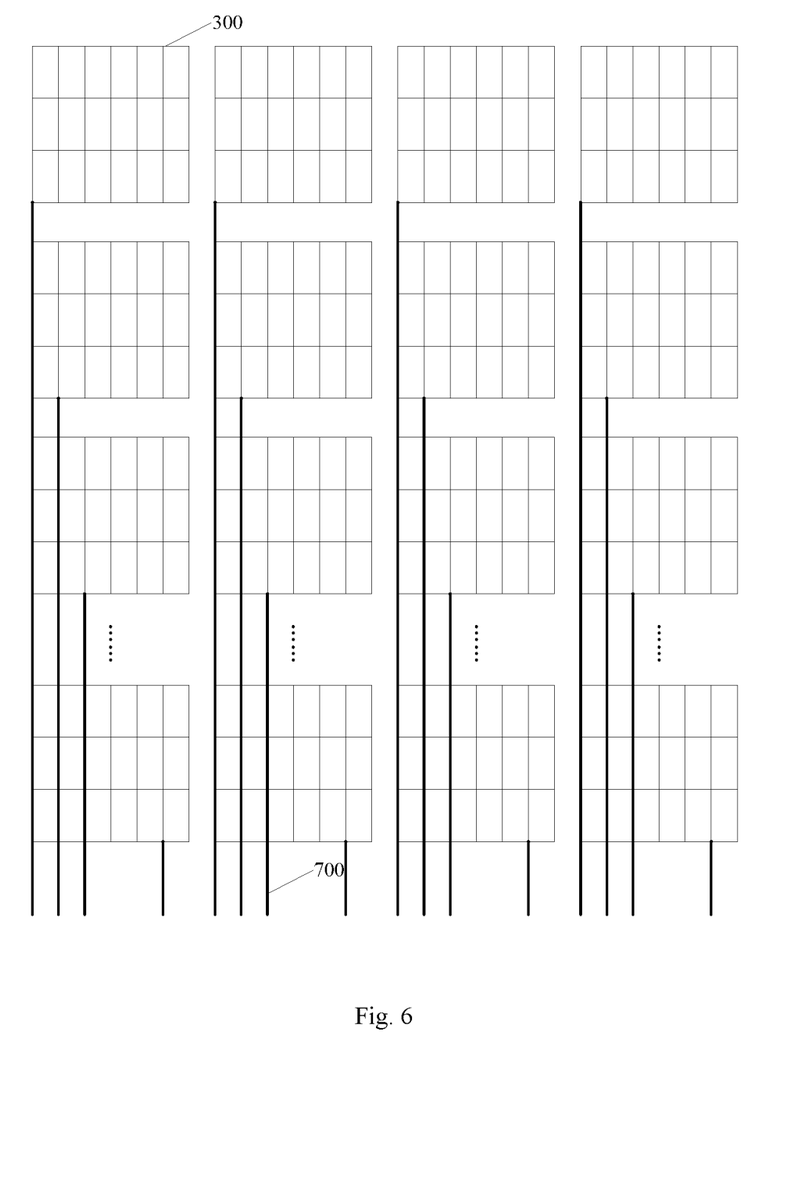
FIG. 6 is a schematic structure diagram illustrating that the touch electrodes and the electrode lead wires are arranged in different layers in the touch screen provided by the embodiments of the present disclosure.

For example, in the touch screen provided by the embodiments of the present disclosure, in order to avoid the touch blind area, as shown in FIG. 6, the electrode lead wires 700 and the touch electrodes 300 are arranged in different layers, that is, all the electrode lead wires 700 are provided in a layer different from the layer where the touch electrodes 300 are provided, then the electrode lead wires 700 and the touch electrodes 300 are electrically connected through via holes.

A manufacturing method of a touch screen is provided in the embodiments of the present disclosure; the manufacturing method includes: providing a base substrate; forming electroluminescence pixel units which are arranged in array on the base substrate; forming touch electrodes arranged in array on the electroluminescence pixel units; and the electroluminescent pixel units and the touch electrodes are insulated from each other.

In the manufacturing method provided in the embodiments of the present disclosure, during forming the touch electrodes which are disposed on the electroluminescence pixel units and insulated from the electroluminescence pixel units, an ink-jet printing method for example is employed to form the touch electrodes. The ink-jet printing method simplifies the process of manufacturing the touch electrodes, and the cost is also reduced. For example, a nano silver, a grapheme or a doped metal solution is used as a printing solution to form the touch electrodes.

Further, in order to ensure that the touch electrodes and the electroluminescence pixel units are insulated from each other and they are not influenced by each other, in the manufacturing method provided in the embodiments of the present disclosure, before forming the touch electrodes by the ink-jet printing method, the manufacturing method further includes forming an insulating layer on the electroluminescent pixel units, or forming a polymer film which is provided on the electroluminescent pixel units and encapsulates side surfaces of the electroluminescent pixel units. Besides, in order to forming the touch electrodes by the ink-jet printing method, after forming the insulating layer or the polymer film, the surface of the insulating layer or the polymer film are roughed. The rough surface of the insulating layer or the polymer film is helpful for printing of the solution material used in the ink-jet printing method. For example, an optical method, an electrical method or a thermodynamic method is used for roughing the surface of the insulating layer or the polymer film, and the method is not limited herein.

Further, in the manufacturing method provided in the embodiments of the present disclosure, forming the electroluminescent pixel units includes forming an anode, a light-emitting layer and a cathode sequentially on the base substrate. For example, the cathodes of the electroluminescence pixel units are independent from each other, and the cathodes of the electroluminescence pixel units are electrically connected by wires located in a gap between the electroluminescence pixel units.

A display device is also provided in the embodiments of the present disclosure and the display device includes the touch screen mentioned above. The display device may be a mobile phone, a tablet computer, a television, a display, a notebook computer, a digital picture frame, a navigation system and any other product or component having a display function. The examples of the display device may refer to the examples of the touch screen and detailed descriptions will be omitted herein.

Embodiments of the present disclosure provide the touch screen and the manufacturing method thereof and the display device, the touch electrodes arranged in array are disposed within the OLED display panel and disposed on the electroluminescence pixel units, the electroluminescent pixel units and the touch electrodes are insulated from each other, so that the thickness of the touch display device is reduced and is favorable for the lightness and thinness design of the products.

It should be noted that, those skilled in the art may make various modifications and variations to the embodiments of present disclosure but not departing from the spirit and scope of the disclosure. Thus, if these modifications and variations of the present invention belong to the scope of the claims of the invention and their equivalents technology, the present invention is also intend to include these modifications and variations.

What are described above is related to the illustrative embodiments of the disclosure only and not limitative to the scope of the disclosure; the scopes of the disclosure are defined by the accompanying claims.

The present application claims the priority of the Chinese Patent Application No. 201510802599.5. filed on Nov. 19, 2015, which is incorporated herein by reference as part of the disclosure of the present application.

What is claimed is:

1. A touch screen, comprising:
   a base substrate,
   electroluminescence pixel units disposed on the base substrate and arranged in array, and
   touch electrodes disposed on the electroluminescence pixel units and arranged in array,
   a polymer film disposed between the electroluminescent pixel units and the touch electrodes, and
   a transparent cover plate disposed on the touch electrodes to cover the touch electrodes,
   wherein each of the electroluminescence pixel units at least comprises an anode, a light-emitting layer and a cathode, and the anodes, the light-emitting layers and the cathodes of the electroluminescent pixel units are insulated from the touch electrodes by the polymer film;
   wherein an orthographic projection of each touch electrode on the base substrate has a mesh structure having openings, and an orthographic projection of only one of the electroluminescent pixel units on the base substrate is within each of the openings of the mesh structure;
   wherein all of the touch electrodes are provided in a same layer;
   wherein all of the touch electrodes are provided between the transparent cover plate and the polymer film, directly contact the transparent cover plate and directly contact the polymer film; and
   wherein the polymer film is provided between the touch electrodes and the cathodes, directly contacts the touch electrodes and directly contacts the cathodes.

2. The touch screen according to claim 1, wherein an orthographic projection of each touch electrode on the base substrate covers at least one of the electroluminescence pixel units.

3. The touch screen according to claim 1, wherein each touch electrode has a hollow area.

4. The touch screen according to claim 1, wherein an orthographic projection of each touch electrode on the base substrate located at a gap between the electroluminescence pixel units.

5. The touch screen according to claim 1, wherein the cathodes of the electroluminescence pixel units are independent from each other and the cathodes of the electroluminescence pixel units are electrically connected through wires which are arranged in a gap between the electroluminescence pixel units.

6. The touch screen according to claim 1, further comprising: electrode lead wires which are connected with the touch electrodes, wherein orthographic projections of the electrode lead wires on the base substrate are located at a gap between the electroluminescence pixel units.

7. The touch screen according to claim 6, wherein the electrode lead wires and the touch electrodes are arranged in the same layer.

8. The touch screen according to claim 1, wherein the touch electrodes are made of a nano silver, a graphene, or a doped metal material.

9. The touch screen according to claim 1, further comprising: an insulating layer arranged between the electroluminescent pixel units and the touch electrodes.

10. The touch screen according to claim 1, wherein the polymer film encapsulates side surfaces of the electroluminescent pixel units.

11. The touch screen according to claim 10, wherein the touch screen is a flexible touch screen.

12. A display device, comprising the touch screen according to claim 1.

13. A manufacturing method of a touch screen, comprising:
    providing a base substrate;
    forming electroluminescence pixel units arranged in array on the base substrate; and
    forming touch electrodes arranged in array on the electroluminescence pixel units; forming a polymer film between the electroluminescent pixel units and the touch electrodes; and
    forming a transparent cover plate on the touch electrodes to cover the touch electrodes,
    wherein each of the electroluminescence pixel units at least comprises an anode, a light-emitting layer and a cathode, and the anodes, the light-emitting layers and the cathodes of the electroluminescent pixel units are insulated from the touch electrodes by the polymer film; and
    wherein an orthographic projection of each touch electrode on the base substrate has a mesh structure having openings, and an orthographic projection of only one of the electroluminescent pixel units on the base substrate is within each of the openings of the mesh structure;
    wherein all of the touch electrodes are provided in a same layer;
    wherein all of the touch electrodes are provided between the transparent cover plate and the polymer film, directly contact the transparent cover plate and directly contact the polymer film; and
    wherein the polymer film is provided between the touch electrodes and the cathodes, directly contacts the touch electrodes and directly contacts the cathodes.

14. The manufacturing method according to claim 13, wherein the touch electrodes are formed by an ink-jet printing method.

15. The manufacturing method according to claim 14, before forming the touch electrodes by the ink-jet printing method, further comprising:
    forming an insulating layer on the electroluminescent pixel units and roughening the surface of the insulating layer.

16. The manufacturing method according to claim 14, before forming the touch electrodes by the ink-jet printing method, further comprising:
    forming the polymer film which is provided on the electroluminescent pixel units and encapsulates side surfaces of the electroluminescent pixel units and roughening the surface of the polymer film.

17. The manufacturing method according to claim 13, wherein the cathodes of the electroluminescence pixel units are independent from each other and the cathodes of the electroluminescence pixel units are connected through wires which are arranged in a gap between the electroluminescence pixel units.

18. The touch screen according to claim 10, wherein the polymer film covers two opposite side surfaces of one of the electroluminescent pixel units to directly contact two opposite side surfaces of the anode of the one of the electroluminescent pixel units, two opposite side surfaces of the light-emitting layer of the one of the electroluminescent pixel units, and two opposite side surfaces of the cathode of the one of the electroluminescent pixel units.

19. The manufacturing method according to claim 16, wherein the polymer film covers two opposite side surfaces of one of the electroluminescent pixel units to directly contact two opposite side surfaces of the anode of the one of the electroluminescent pixel units, two opposite side surfaces of the light-emitting layer of the one of the electroluminescent pixel units, and two opposite side surfaces of the cathode of the one of the electroluminescent pixel units.

20. The touch screen according to claim 1, wherein the polymer film does not directly contact the transparent cover plate.

* * * * *